(12) United States Patent
Nakagawa (10) Patent No.: US 6,756,272 B1
(45) Date of Patent: Jun. 29, 2004

(54) METHOD OF MANUFACTURING NON-VOLATILE SEMICONDUCTOR MEMORY DEVICE

(75) Inventor: Kenichiro Nakagawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/544,046

(22) Filed: Apr. 6, 2000

Related U.S. Application Data

(62) Division of application No. 09/407,726, filed on Sep. 28, 1999.

(30) Foreign Application Priority Data

Oct. 1, 1998 (JP) ............................................. 10-280356

(51) Int. Cl.[7] ........................................... H01L 21/8247
(52) U.S. Cl. ......................... 438/264; 438/549; 438/981
(58) Field of Search ................................ 438/257, 264, 438/529, 545, 549, 981

(56) References Cited

U.S. PATENT DOCUMENTS

| | | | | |
|---|---|---|---|---|
| 4,833,096 A | * | 5/1989 | Huang et al. ................ | 438/264 |
| 5,210,048 A | * | 5/1993 | Shoji et al. .................. | 438/257 |
| 5,404,037 A | | 4/1995 | Manley ........................ | 257/321 |
| 5,859,453 A | | 1/1999 | Ahn ............................. | 257/314 |

FOREIGN PATENT DOCUMENTS

| | | |
|---|---|---|
| JP | 60-110163 | 6/1985 |
| JP | 61-174774 | 8/1986 |
| JP | 63-283070 | 11/1988 |
| JP | 63-306671 | 12/1988 |
| JP | 1-211979 | 8/1989 |
| JP | 2-37778 | 2/1990 |
| JP | 02-174171 | 7/1990 |
| JP | 3-46375 | 2/1991 |
| JP | 4-348081 | 12/1992 |
| JP | 6-69516 | 3/1994 |
| JP | 6-283721 | 10/1994 |
| JP | 7-45726 | 2/1995 |
| JP | 09-102555 | 4/1997 |

* cited by examiner

*Primary Examiner*—Chandra Chaudhari
(74) *Attorney, Agent, or Firm*—Scully, Scott, Murphy & Presser (57) ABSTRACT

Memory cells 10, according to the present invention, are comprised of a semiconductor substrate 2, and device isolating/insulating films 3 on the semiconductor substrate 2. A source region 4 and drain regions 5 are formed on the surface of the semiconductor substrate 2 within the device fabricating region, which is enclosed with the device isolating/insulating films 3. Floating gate electrodes 24 are formed above the semiconductor substrate 2. Each channel/gate insulating film 14a is formed between each channel region 23 and its corresponding floating gate electrode 24. Wherein, each channel region 23 is located between the source region 4 and one of the drain regions 5. Each tunnel oxide film 15, which is thinner than each channel/gate insulating film 14a, is formed between part of each drain region 5 and its corresponding floating gate electrode 24. Wherein the part is located far away from the depletion layer, which exists between each drain region 5 and its adjacent channel region 23. Each floating gate electrode 24 is insulated by an ONO (oxide/nitride/oxide) film 22, on which a control gate 6 is formed.

23 Claims, 8 Drawing Sheets

METHOD OF MANUFACTURING NON-VOLATILE SEMICONDUCTOR MEMORY DEVICE

This application is a divisional of patent application Ser. No. 09/407,726 filed Sep. 28, 1999.

BACKGROUND OF THE INVENTION

1. Field of the Invention

The present invention relates to non-volatile semiconductor memory device. In particular, one with an improved writing/erasing speed and reliability of the memory cells. The present invention also relates to a method of manufacturing this non-volatile semiconductor memory device.

2. Prior Arts

For the conventional non-volatile semiconductor memory devices that can electrically write and erase data, there are demands for improved writing and erasing speeds. In order to respond to these, several types of non-volatile semiconductor memory devices, which are disclosed in Japanese Patent Application Laid-open Nos. Hei-1-211979, Hei-4-348081, Hei-6-69516, and Hei-6-283721, have been proposed, where the writing/erasing speed and the reliability of the memory cells is improved by changing the thickness of the oxide film.

Figure 1A:
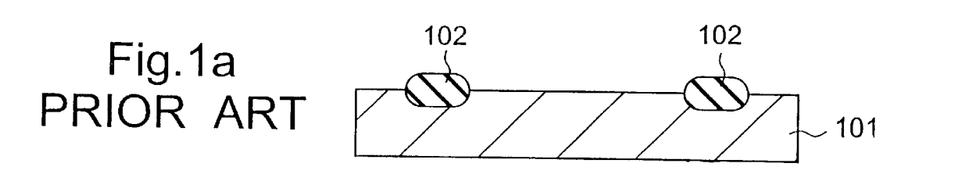
FIGS. 1a to 1d are process cross-sections of the conventional non-volatile semiconductor memory device showing a method of fabrication.
Figure 1B:
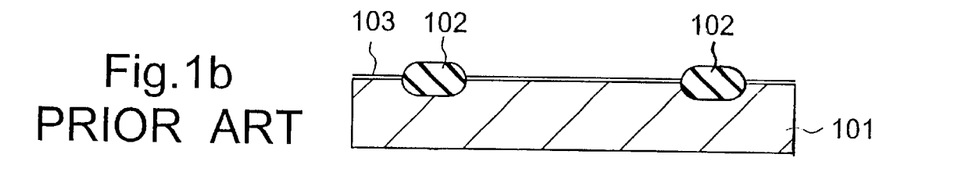
Figure 1C:
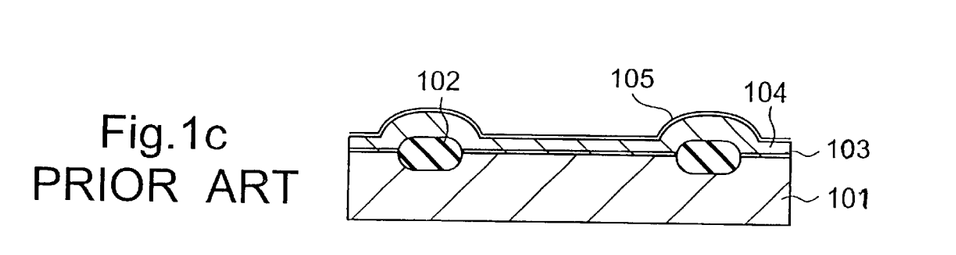
Figure 1D:
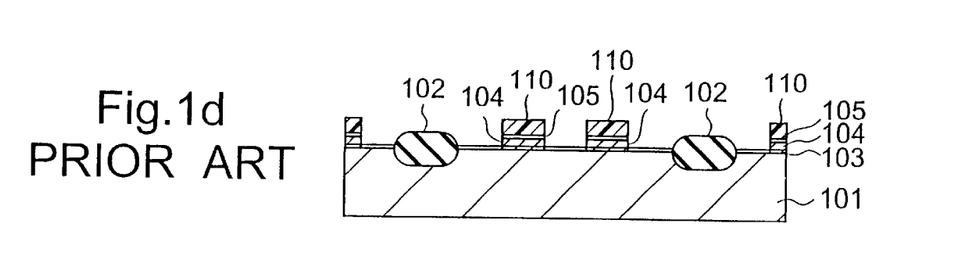
Figure 2A:
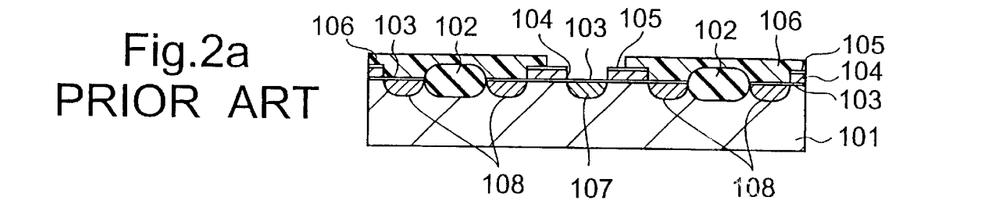
FIGS. 2a to 2c are process cross-sections of the conventional non-volatile semiconductor memory device showing a subsequent process of fabrication.
Figure 2B:
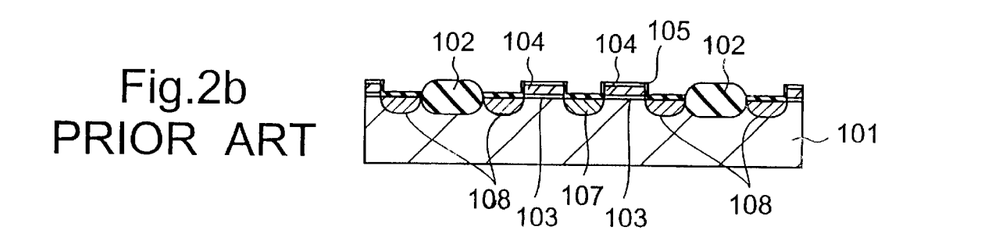
Figure 2C:
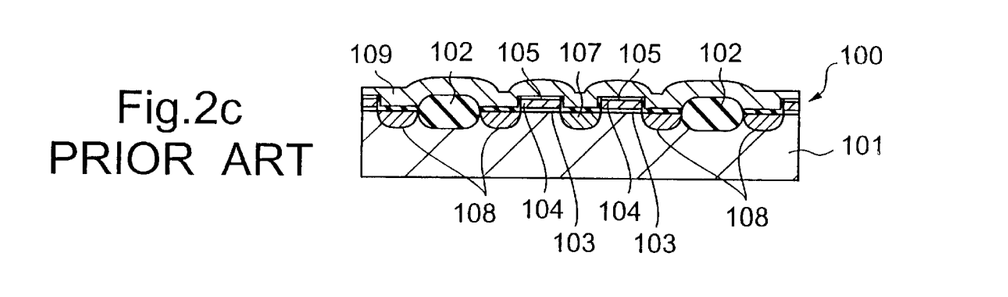

FIGS. 1a to 1d and FIGS. 2a to 2c are cross-sections showing the process steps of manufacturing the conventional non-volatile semiconductor memory device as disclosed in Japanese patent Application Laid-open No. Hei-6-283721. As shown in FIG. 1a, device separators 102 are formed on a substrate 101 using a conventional method with the lithographic process. As shown in FIG. 1b, a silicon oxide film 103, from which tunnel oxide films will later be formed, is then deposited on top of the substrate 101. As shown in FIG. 1c, a polysilicon film 104, from which floating gate electrodes 104 will later be formed, is then deposited. An ONO film 105, made up of a silicon oxide film, a silicon nitride film, and a silicon oxide film, which are grown one by one, is then formed. The ONO layer 105 serves as a capacitor film located between a control electrode and the floating gate electrode 104. As shown in FIG. 1d, the ONO film 105 and polysilicon film 104 are both patterned by lithography using the resist mask 110. Thereafter, doping with ions such as phosphorous or arsenic is performed, so as to form source regions 107 and drain regions 108 (see FIGS. 2a to 2c ). Next, as shown in FIG. 2a, only the drain regions 108 are masked by a resist mask 106, and the source regions 107 are then doped with ions. As a result, each source region 107 is changed into a high voltage-proof structure. Next, as shown in FIG. 2b, the resist mask 106 is removed, and the top surfaces of the diffused regions and the sides of the floating gate electrodes 104 are then all oxidized. Next, as shown in FIG. 2c, a polysilicon film 109, from which control gates will later be formed, is deposited. Afterwards, the control gate electrodes 109, capacitor films 105, and floating gate electrodes 104 are patterned. Consequently, the non-volatile semiconductor memory device 100 is completed.

According to the conventional non-volatile semiconductor memory device, since the floating gate electrode is overlapped with the outer area of its corresponding drain region, the impurity concentration of most of the overlapped drain region is low, and an expansion of the depletion layer may easily occur. Since the voltage applied to the drain region is used to extend the depletion layer, the actual voltages applied to the tunnel oxide film is low. According to the conventional non-volatile semiconductor memories, there is a problem where the writing speed is low due to the fact that it is impossible to apply a high voltage to the tunnel oxide film between the floating gate electrode and drain region.

In the structure of the non-volatile semiconductor memory device 100 and the method of manufacturing the same as described above, in order to improve the hot electron holding capability and high voltage-proof capability when a writing or an erasing operation is performed, a thick gate oxide film is deposited on the overlapped region between each floating gate electrode 104 and its corresponding drain region 108.

According to the conventional non-volatile semiconductor memories, however, there is a problem where the writing speed is low due to the fact that it is impossible to apply a high voltage to the tunnel oxide film between the floating gate electrode and drain region.

According to the conventional non-volatile semiconductor memories, besides, there is a problem with the poor reliability of the memory cells. That is to say, since the floating gate electrode is overlapped with the outer area of the drain region, holes are generated due to the tunnel effect that occurs between the energy bands. As a result, the memory cells may deteriorate, and have low reliability.

SUMMARY OF THE INVENTION

Accordingly, the present invention is provided taking the above problems into consideration. An objective of the present invention is to provide a non-volatile semiconductor memory device with an improved writing/erasing speed and improved reliability of the memory cells. Another objective of the present invention is to provide a method of manufacturing this memory device.

Figure 3:
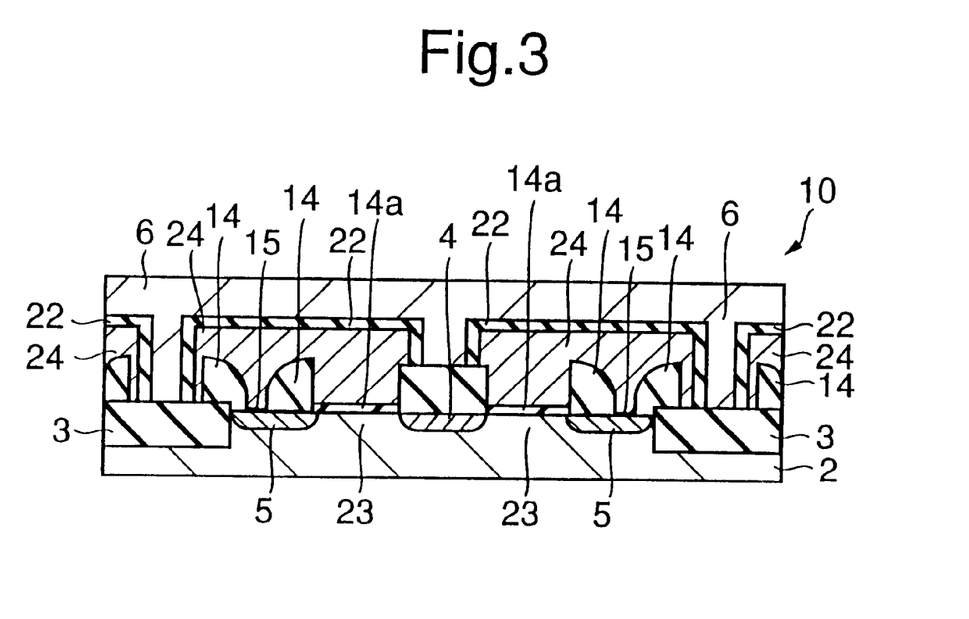
FIG. 3 is a cross-section showing the memory cells of a non-volatile semiconductor memory device, according to the first embodiment of the present invention.

To attain the above objective, according to an aspect of the present invention, a non-volatile semiconductor memory device is provided, comprising a first insulating film(15), which is sandwiched between part of a drain region (5) and part of a floating gate (24), and which is located far away from the depletion layer between the said drain region (5) and a channel region (23), and a second insulating film (14), which is also sandwiched between the other part of the said drain region (5) and another part of the said floating gate (23), and which is thicker than the first insulating film (15). An example of the non-volatile semiconductor memory device is illustrated in FIG. 3. The above reference numerals put in the parentheses are attached to respective corresponding elements in FIG. 3.

According to an aspect of the present invention, a non-volatile semiconductor memory device is provided, comprising a first and second a memory cell which is located next to the said first memory cell, where the said first and the second memory cell share a source region; wherein, each of the said first and the said second memory cell are comprised of: a first insulating film(15), which is sandwiched between a part of a drain region (5) and a part of a floating gate (24), and which is located far away from the depletion layer between the said drain region (5) and a channel region (23); and a second insulating film (14), which is also sandwiched between the other part of the said drain region (5) and another part of the said floating gate (23), and which is thicker than the first insulating film (15). An example of the non-volatile semiconductor memory device is illustrated in FIG. 3. The above reference numerals put in the parentheses are attached to respective corresponding elements in FIG. 3.

According to an aspect of the present invention, a method of manufacturing a non-volatile semiconductor memory device is provided, comprising: a depositing step of depositing a first insulating film (14) on top of a drain region; a removing step of removing a part of the said first insulating film deposited (14), where the part is located far away from its corresponding depletion layer; and an oxidizing step of oxidizing the surface area of the said part, so as to form a second insulating film (15), which is thinner than the said first insulating film (14). An example of the above method is illustrated in FIGS. 5a to 5i. The above reference numerals put in the parentheses are attached to respective corresponding elements in FIGS. 5a to 5i.

BRIEF DESCRIPTION OF DRAWINGS

The above and other objects, features and advantages of the present invention will become apparent in the embodiment section from the following detailed description, when taken in conjunction with the accompanying drawings, wherein.

DETAILED DESCRIPTION OF THE PREFERRED EMBODIMENTS

Figure 4:
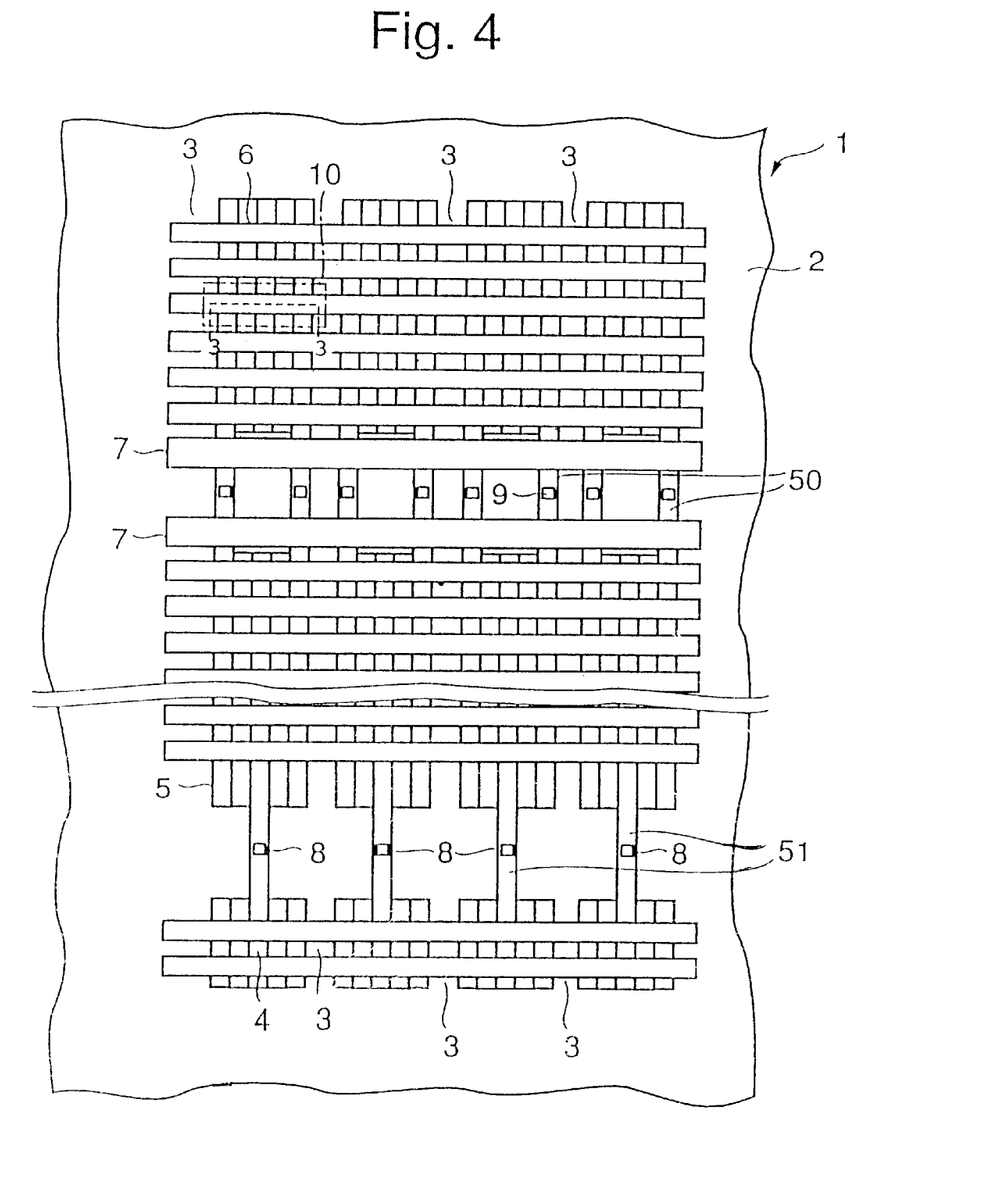
FIG. 4 is an aerial view showing the layout of the non-volatile semiconductor memory device, according to the first embodiment of the present invention.

Hereafter, a non-volatile semiconductor memory device, according to the first embodiment of the present invention, will be described in reference to the figures. FIG. 3 is a cross-section showing part of memory cells 10 of the non-volatile semiconductor memory device, according to the first embodiment of the present invention, as shown in FIG. 4, cut along the line 3—3. FIG. 4 shows an aerial view of the non-volatile semiconductor memory device.

As shown in FIG. 3, the memory cells 10, according to the present invention, are comprised of a semiconductor substrate 2, and device isolating/insulating films 3 on the semiconductor substrate 2. A source region 4 and drain regions 5 are formed on the surface of the semiconductor substrate 2 within the device fabricating region, which is enclosed with the device isolating/insulating films 3. Floating gate electrodes 24 are formed above the semiconductor substrate 2. Each channel/gate insulating film 14a is formed between each channel region 23 and its corresponding floating gate electrode 24. Wherein, each channel region 23 is located between the source region 4 and one of the drain regions 5. Each tunnel oxide film 15, which is thinner than each channeled/gate insulating film 14a, is formed between part of each drain region 5 and its corresponding floating gate electrode 24. Wherein the part is located far away from the depletion layer. which exists between each drain region 5 and its adjacent channel region 23. Each floating gate electrode 24 is insulated by an ONO (oxide/nitride/oxide) film 22, on which a control gate 6 is formed.

Each thin silicon oxide film, namely, each tunnel oxide film 15 is formed only on the central area of each drain region, 5, whereas each thicker silicon oxide film 14 than the tunnel oxide film 15 is formed on the other area of it. Since each tunnel oxide film 15, which is deposited on top of the central area of the drain region 5, is thin, it is possible to apply a high voltage. As a result, the speed of writing and erasing data in the memory cells 10 can be fast. Incidentally, it is preferable that the width of the above tunnel oxide film 15 ranges from 0.05 $\mu$m to 0.1 $\mu$m.

As shown in FIG. 4, the non-volatile semiconductor memory device 1, according to the first embodiment of the present invention, is made up of a plurality of memory cells 10. In the non-volatile semiconductor memory device 1, for example, between sixteen to one hundred and twenty-eight memory cells 10 are connected to a control gate electrode 6 or a selecting gate 7 via a source contact 8 and bit contact 9. The memory cells 10 share a sub-bit line 50 and a sub-source line 51. Wherein, the sub-bit line 50 is connected to a trunk bit line (not shown in the figure) via a selecting transistor (not shown in the figure), whereas the sub-source line 51 is directly connected to a trunk source line (not shown in the figure). Sub-bit lines 50 are laid on both sides of the sub-source line. The memory cells, connected to the respective sub-bit lines, share their central sub-source line 51. The arrangement as described above allows the total area of the memory cells to be small. With this arrangement, an operation of writing a memory cell is performed in the following manner. Namely, a writing voltage is applied to the trunk bit line by turning on the selecting transistor, which is connected to one of the sub-bit lines 50. In this state, since the writing voltage is also applied to the sub-bit line via the selecting transistor, the memory cell connected to the sub-bit line is selected and data is stored within.

Next, a method of manufacturing the non-volatile semiconductor memory device, according to the first embodiment of the present invention, will be described. FIGS. 5a to 5i are cross-sections of the non-volatile semiconductor memory device, according to the first embodiment of the present invention, showing a manufacturing process.

Figure 5A:
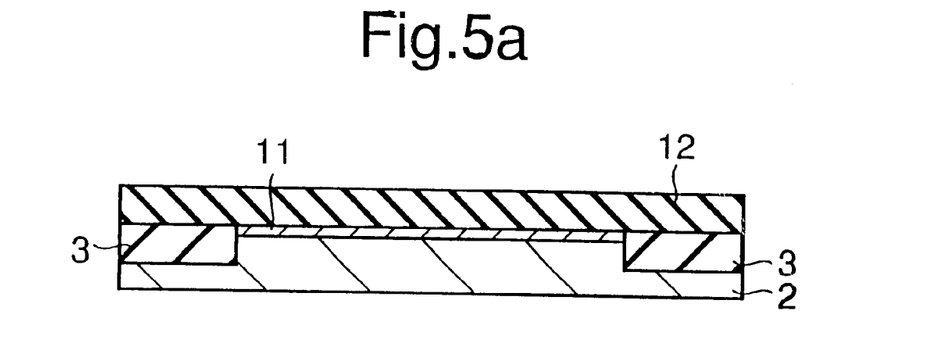
FIGS. 5a to 5i are process cross-sections showing a method of fabricating the non-volatile semiconductor memory device, according to the first embodiment of the present invention.

As shown in FIG. 5a, device isolating/insulating films 3 are formed on the semiconductor substrate 2 using a conventional process such as a lithographic process. Afterwards, a silicon oxide film, namely an insulating film 11 as thick as, for example, 150 to 250 angstroms is grown on top of the device region between the device isolating/insulating films 3. A silicon nitride film, namely a nitride film 12 as thick as 1000 to 3000 angstroms is deposited next, on top of the insulating film 11.

Figure 5B:
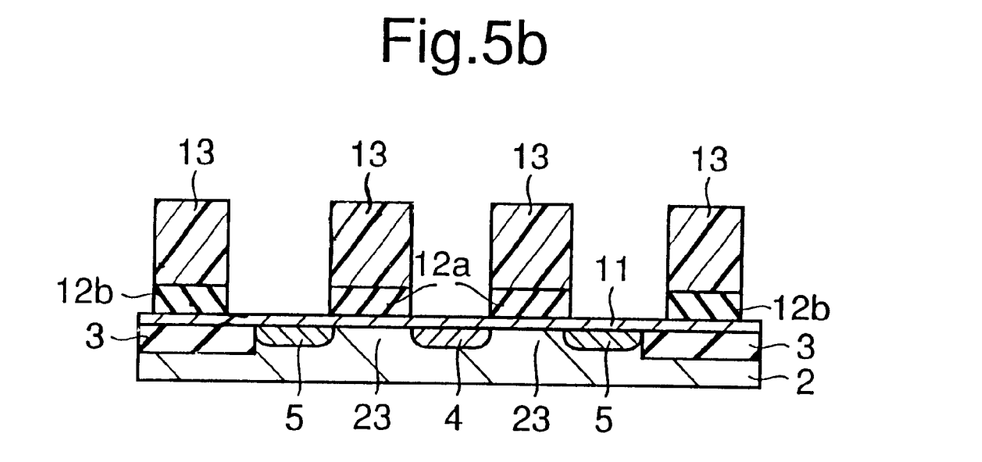

Next, as shown in FIG. 5b, the given shape of the resist mask 13 is laid on top of the nitride film 12. This patterns the nitride film 12 so the areas on top of prospective channel regions 23 and the device isolating/insulating films 3 can remain as they are. As a result, a plurality of first nitride films 12a are formed above the channel regions 23, whereas a plurality of second nitride films 12b are formed on top of the device isolating/insulating films 3. The resist mask 13 is then removed. Afterwards, prospective source and drain regions are doped with ions of $10^{15}$ $cm^{-2}$ such as phosphorous or arsenic, so as to form a source region 4 and drain regions 5. It is preferable that the interval between the adjacent, first nitride films 12a on top of the respective channel regions 23, is shorter than that between each second nitride film 12b on top of its corresponding device isolating/insulating film 3 and its adjacent first nitride film 12a above its corresponding channel region 23. Specifically, the interval between the first nitride films 12a on the channel regions 23 is set to, for example, 0.3 μm; whereas the interval between each second nitride film 12b on top of its corresponding device isolating/insulating film 3 and its adjacent first nitride film 12a above its corresponding channel region 23 is set to 0.4 μm.

Figure 5C:
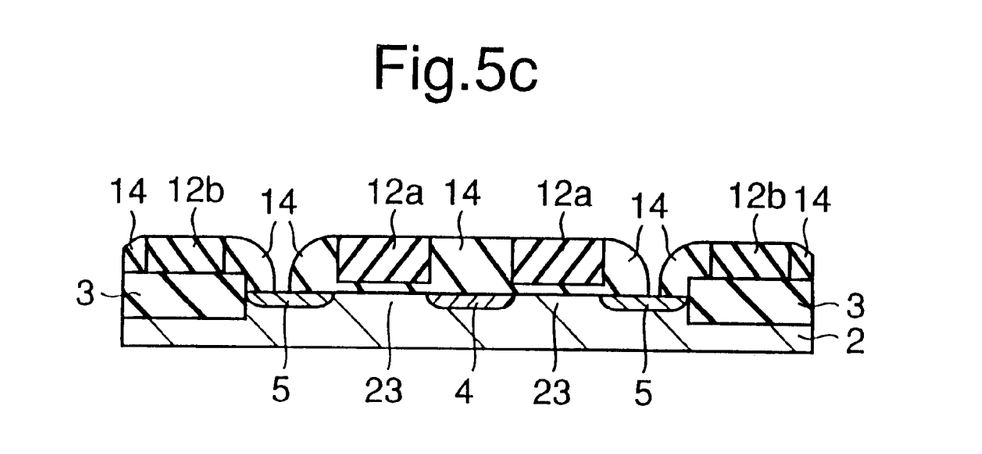

Next, as shown in FIG. 5c, an insulating film 14 as thick as, for example, 1000 to 2000 angstroms is grown using the CVD (Chemical Vapor Deposition) system, and then etched back, after the resist 13 is removed. At the same time, side walls made of a silicon oxide film are formed around the first and second nitride films 12a and 12b. The thick insulating film 14 on top of the source region 4 is left intact. An area of the insulating film 14, which is located on the center of each drain region 5, is removed. As a result, the outside of each drain region 5 is covered by the thick insulating film 14. That is to say, each drain region 5 is made up of two regions: one on which the thick silicon oxide film is formed, and the other on which a thin silicon oxide film is later formed.

Figure 5D:
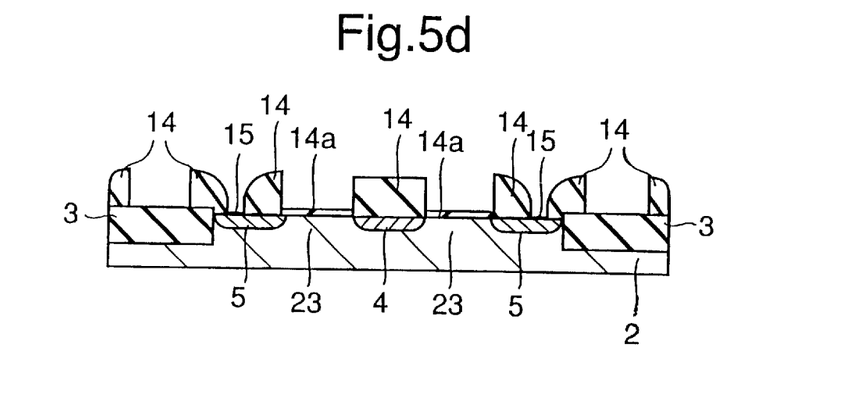

Next, as shown in FIG. 5d, a heat treatment for oxidizing the resulting surface area as thick as, for example, approximately 100 angstroms is performed. The first and second nitride films 12a and 12b, and part of the insulating film 14 located on the channel regions 23 are then all removed. The resulting entire surface is then oxidized. Afterwards, the oxide film on the center of each drain region 5 is removed using a resist mask (not shown in the figure). The resist mask is then removed. Tunnel oxide films 15 is formed next, by oxidizing again. In this case, the first and the second oxidizing processes form channel/gate insulating films 14a as thick as, for example, 150 to 300 angstroms on top of their respective channel regions 23. The second oxidizing process forms silicon oxide films, namely the tunnel oxide films 15 as thick as, for example, 80 to 120 angstroms on the respective centers of the drain regions 5. In addition, since the thin silicon oxide films are formed on the respective centers of the drain regions 5, only the areas on the respective center of the drain regions 5 can be etched off. This is performed by controlling the etching time using a resist mask, which masks only the channel regions 23. Incidentally, it is preferable that the thickness of the tunnel oxide films 15 is equal to between 80 to 120 Å. It is also preferable that, for the purpose of providing a high capacity ratio, the thickness of the insulating films 14a and 14 are much thicker, by an order of one digit, than that of the tunnel oxide films 15.

Figure 5E:
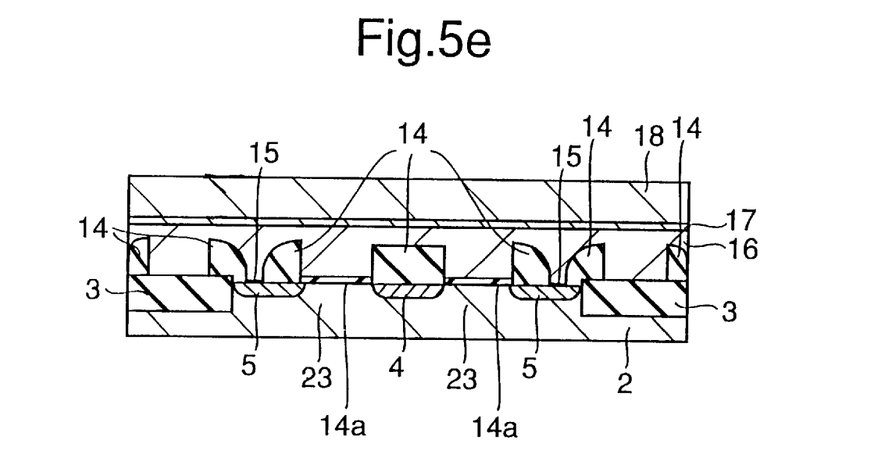
Figure 5F:
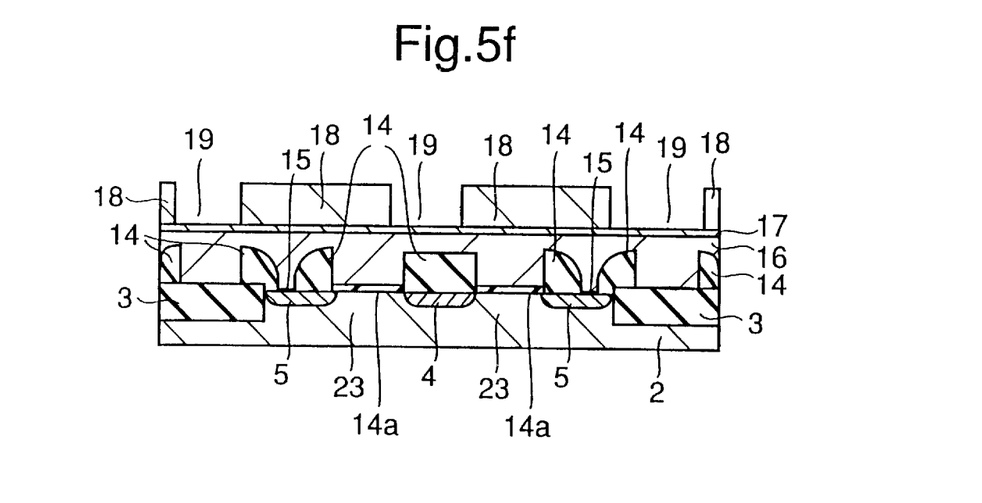
Figure 5G:
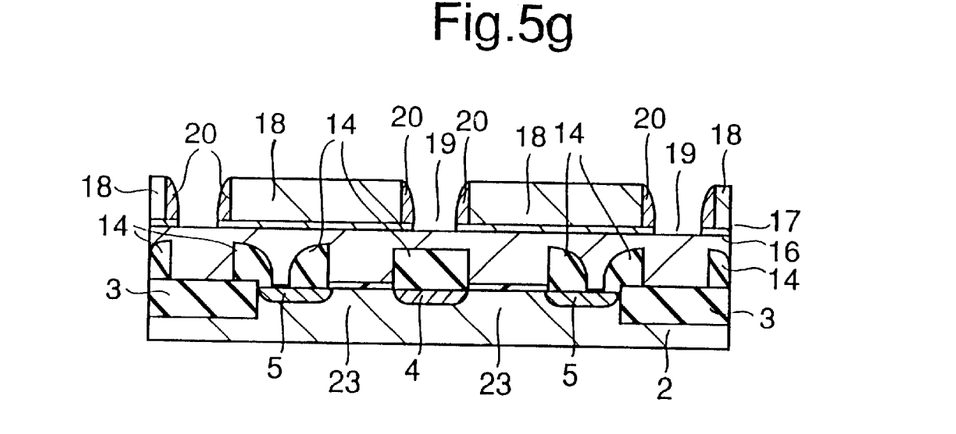

Next, as shown in FIG. 5e, a polysilicon film 16, which is used to form a gate, is deposited as thick as, for example, 1000 to 2000 angstroms. An inter-layer insulating film 17, made of a silicon oxide film, as thick as, for example, 100 to 300 angstroms is then deposited on the resulting surface. A polysilicon film 18 as thick as, for example, 1000 angstroms or more is deposited next. As shown in FIG. 5f, the polysilicon film 18 is then selectively etched off, so as to form concave regions 19 using a resist mask (not shown in the figure). As shown in FIG. 5g, a polysilicon film is grown again and etched back next, to form side walls 20, each being made of a polysilicon film, on the concave regions 19.

Figure 5H:
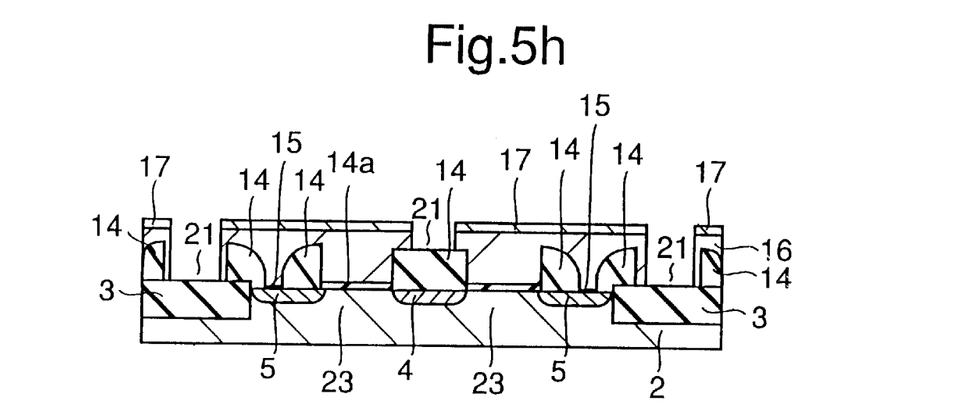

Next, as shown in FIG. 5h, the inter-layer insulating film 17 is etched using the etched polysilicon films 18 as a mask. The etched polysilicon films 18 and the polysilicon gate film 16 are both simultaneously and selectively etched next, so as to form ditches 21 which reach the surfaces of the insulating films 14 and device isolating/insulating films 3. It is noted that the thickness of the insulating film 14 on top of the source region 4 is approximately equal to that of the insulating films 14 on the respective drain regions 5. This allows the source region 4 to be free from possible damage caused by the etching process. In addition, using side walls 20 allows each of the concave regions 19 to be formed (see FIG. 5g), with their size less than that required by the minimum design rules, even if the nitride films 12a, the concave regions 19, etc., (see FIG. 5f) are designed based on the minimum design rules. Therefore, the problem of the polysilicon of the channel regions 23 being able to be unnecessarily etched caused by a patterning gap is eliminated.

Figure 5I:
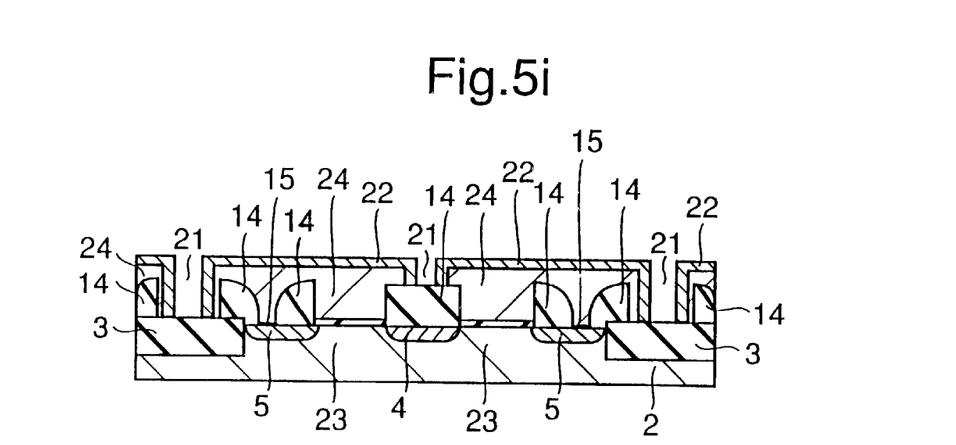

As shown in FIG. 5i, An ONO film 22, made up of a $SiO_2$ film, a $Si_3N_2$ film, and a $SiO_2$ film is deposited, after the oxide films on the polysilicon gate films 16 are removed. The regions surrounded by the ONO film 22 become floating gate electrodes 24.

Next, a polysilicon film, namely a control gate electrode 6 is grown, so as to fill the ditches 21. The polysilicon gate films 16, the ONO film 22, and the polysilicon films 18 are simultaneously etched, so as to form the memory cells as shown in FIG. 3. It is noted that a silicide, such as a tungsten silicide, can be deposited after the polysilicon film is grown, so that a low resistance of control gate electrode 6 can be formed.

Through the process as described above, the interval between the first nitride films 12a on top of the respective channel regions 23, is shorter than that between each second nitride film 12b on top of its corresponding device isolating/insulating film 3 and its adjacent first nitride film 12a above its corresponding channel region 23. Each thin silicon oxide film, namely each tunnel oxide film 15 is formed only on the central area of each drain region 5, whereas each thicker silicon oxide film than the tunnel oxide film 15 is formed, so as to cover the remaining area of the region. Since each tunnel oxide film 15, which is deposited on top of the central area of the drain region 5, is thin, it is possible to apply a high voltage. As a result, the speed of writing and erasing data in the memory cells 10 can be fast.

Next, an operation of writing data in the memory cells, fabricated through the process as described above, will be explained. An application of a negative voltage of, for example, −9 Volts to the control gate electrode 6 and a positive voltage of, for example, 4 volts to one of the drain region 5, causes a generation of a Fowler-Norheim tunnel current (hereafter, called a FN tunnel current). As a result, electrons are drained from corresponding floating gate electrode 24 into the corresponding drain region 5. This is a write operation. On the other hand, when a positive voltage of, for example, 12 volts is applied to the control gate electrode 6 and one of the drain regions 5 is grounded, the FN tunnel current is generated. As a result, electrons are injected from the drain region 5 into its corresponding floating gate electrode 24. This is an erasing operation.

When writing in a selected memory cell, the drains and gates of not-selected memory cells are disabled. However, a plurality of memory cells sharing a word line can be simultaneously written. This shortens the gate disabling time. In addition, this causes an improvement of the speed of writing a bit of memory cell. Moreover, the drain disabling time is shortened by inserting transistors, each of which is used to select a plurality of memory cells, providing trunk bit lines and sub-bit lines, and simultaneously selecting a sub-bit line as well as a trunk bit line.

When reading data from a memory cell, a positive voltage of, for example, 3 volts is applied to the control gate electrode 6, and a positive voltage of, for example, 1 volt to one of the drain regions 5. In this state, whether data is logical zero or one is determined by detecting whether or not an electric current flows through the corresponding channel 23.

According to this embodiment, the silicide is formed, so as to provide a low resistance. However, the type of silicide used is not limited to tungsten silicide. Alternatively, cobalt silicide, titanium silicide, or nickel silicide can be used.

Furthermore, according to this embodiment, the interval between the second nitride film 12b on each device isolating/insulating film 3 and its adjacent, first nitride film 12a above its corresponding channel region 23, and the interval between the first nitride films 12a above the respective channel regions 23 are adjusted, so that the region on the central area of each drain region 5 cannot be covered by the insulating film 14. In addition, the remaining area on each drain region 5 can be covered by a thicker insulating film 14 than the tunnel oxide film.

Figure 6:
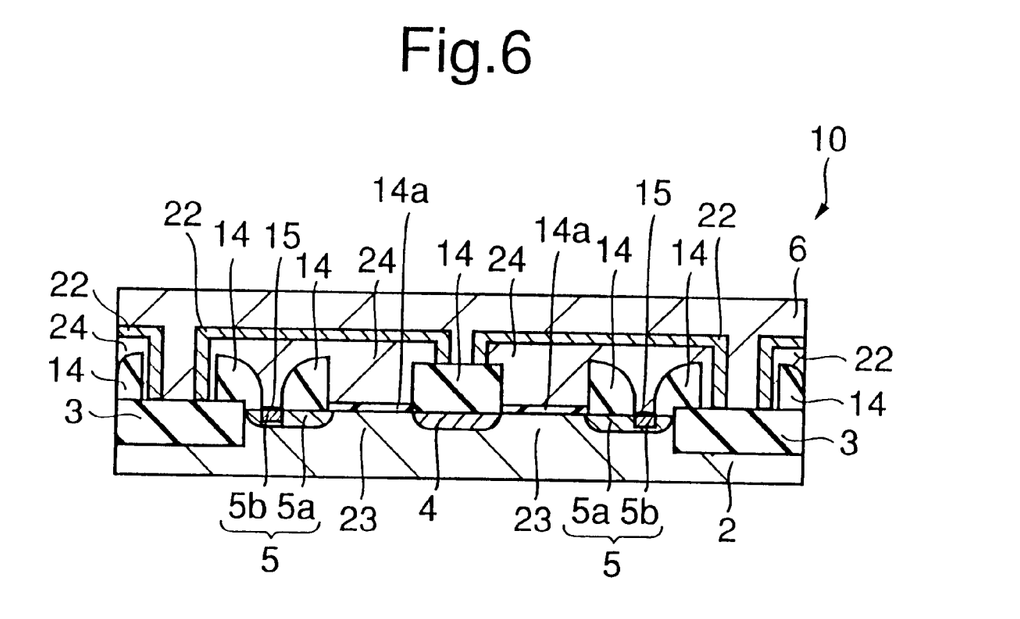
FIG. 6 is a process cross-section showing the memory cells of a non-volatile semiconductor memory device, according to the second embodiment of the present invention.

Next, a second embodiment of the present invention will be described. FIG. 6 is a cross-section showing the configuration of memory cells in a non-volatile semiconductor memory device, according to the second embodiment of the present invention. In the description that follows, identical elements to those in FIGS. 3, 4, and 5a to 5i are attached with the same reference numerals as those used in FIGS. 3, 4, and 5a to 5i. Accordingly, their corresponding detailed explanation is omitted.

The memory cells 10 in the non-volatile semiconductor memory device, according to the second embodiment of the present invention, have the same structure as those in the first embodiment, except that the structure of the drain regions 5 is different. According to the second embodiment, each drain region 5 has a dual structure, made up of a first drain region 5a and second drain region 5b. Wherein, the first drain region 5a is formed under the tunnel oxide film 15, whereas the second drain region 5b is formed, so as to enclose the first drain region 5a. The amount doped in the first drain region 5a is different from that of the second drain region 5b. Specifically, the latter is more than the former.

Next, a second method of manufacturing the non-volatile semiconductor memory device, according to the second embodiment of the present invention, will be described. The process, as shown in FIGS. 5a to 5c, before the step of forming the tunnel oxide films 15 is performed, is the same as that of the first embodiment. After this same process is performed, according to the second method of manufacturing the memory device, the central surface area of each drain region 5 is oxidized, and then doped with a large amount of arsenic by giving it a low doping energy. Wherein, this central surface area is located far way from the depletion layer between the drain region 5 and its corresponding channel region 23. Doping the above area with a large amount of arsenic utilizing a low doping energy, results in the formation of the second drain region 5b, As a result, each drain region 5 is formed with a dual structure, namely each has two regions with different amounts of doping. The subsequent process of fabricating the memory cells 10 in the non-volatile semiconductor memory device, according to the present invention, is the same as that of the first embodiment.

As described above, according to the second embodiment, each drain region 5 has the dual structure where the high concentration doped region is formed directly under the tunnel oxide film 15. This allows an increase in the impurity concentration of the part of the drain region 5 overlapped with the floating gate electrode 24, whatever the withstand voltage of the drain region 5 may be. Consequently, an occurrence or expansion of the depletion layer is controlled, and a voltage is efficiently applied to the tunnel oxide film 15, so that the data writing/erasing speed can be improved.

Next, the voltage applied to the tunnel oxide film 15, according to the present invention, is calculated and compared to that of the conventional one.

In this embodiment, the writing speed when writing with the help of a FN tunnel current, is dependent on the magnitude of an electric field, which affects the silicon oxide film (tunnel oxide film) that a FN tunnel current flows through. The magnitude of the electric field is dependent on the capacitances among the floating gate electrode, the control gate electrode, the drain region, the source region, and the channel region.

The electric charge in the floating gate electrode, Q, is represented by the following equation, eq1:

$$Q = Cfd(Vfg-Vd) + Cfc(Vfg-Vcg) + Cfs(Vfg-Vs) + Cfsub(Vfg-Vsub) \quad (\text{eq 1})$$

Where

Cfc=capacitance between control gate electrode and floating gate electrode;

Cfd=capacitance between drain region and floating gate electrode;

Cfs=capacitance between source region and floating gate electrode;

Cfsub=capacitance between channel region and floating gate electrode;

Vfg=voltage of floating gate electrode;

Vcg=voltage of control gate electrode;

Vd=voltage of drain region;

Vs=voltage of source region; and

Vsub=voltage of channel region.

When writing, the voltages of the source region and channel region are set to zero. Therefore, eq1 can be modified as follows:

$$Vfg = (Cfd \times Vd + Cfc \times Vcg + Q)/Ctot$$

$$Ctot = Cfd + Cfc + Cfs + Cfsub \quad (\text{eq2})$$

Next, for comparison of the non-volatile semiconductor memory device, according to the present invention, to the conventional one, a voltage applied to the tunnel oxide film is calculated. It is assumed here that channel length=0.25 μm;

drain region's width=0.35 μm;

tunnel region's length=0.05 μm;

height of floating gate electrode above source region=0.15 μm:

height of floating gate electrode on device isolating/insulating film 0.25 μm;

thickness of tunnel oxide film=80 angstroms;

thickness of channel region=200 angstroms; and thickness of ONO film when it is converted into that of silicon oxide film=120 angstroms.

In addition, when the voltages of the source region and channel region (Vs and Vsub) are put together for simplification, and Q=0, Vfg can be expressed as $$Vfg = (0.05/0.008 \times Vd + 1.2/0.012 \times Vcg)/(1.2/0.012 + 0.05/0.008 + 0.25/0.02) = (Vd + 16 \times Vcg)/19.$$

Furthermore, if voltage applied to control gate electrode=−8 volts, and voltage applied to drain region=4 volts, the voltage applied to the tunnel oxide film |Vfg−Vd| can be expressed as $$|Vfg-Vd|=|(4+16\times(-8))/19-4|=10.5 \text{ volts}. \quad \text{(eq3)}$$

Incidentally, according to the conventional non-volatile semiconductor memory device, the heights of the floating gate electrodes on the device isolating/insulating film and above the source region are both equal to 0.15 μm. In addition, the drain region, connected to its adjacent channel region, is overlapped with its corresponding floating gate electrode. Therefore, the voltage of the floating gate electrode 24, Vfg can be calculated from the following equation:

$$Vfg=(0.05/0.008\times Vd+1.1/0.012\times Vcg)/(1.1/0.012+0.05/0.008+0.20/0.008)=(3\times Vd+44\times Vcg)/59.$$

The voltage applied to the tunnel oxide film |Vfg−Vd| in the identical prerequisite to the non-volatile semiconductor memory device, according to the present invention, can be calculated from the following equation:

$$|Vfg-Vd|=|(3\times4+44\times(-8))/59-4|=9.76 \text{ volts}. \quad \text{(eq4)}$$

In actual conditions, since the voltages as shown in eq3 and eq4 are also used to bend the energy band and/or extend the depletion layer, the actual voltages applied to the tunnel oxide film is lower than the respective voltages shown in eq3 and eq4. According to the conventional non-volatile semiconductor memory device, since the floating gate electrode is overlapped with the outer area of its corresponding drain region, the impurity concentration of most of the overlapped drain region is low, and an expansion of the depletion layer may easily occur by applying the above voltage |Vfg−Vd| as expressed in eq4. On the other hand, according to the non-volatile semiconductor memory device of the present invention, since the floating gate electrode is overlapped with only the high impurity concentration part of the drain region, even though the above voltage |Vfg−Vd| expressed in eq3 is applied to the tunnel oxide film, an occurrence or expansion of the depletion layer is controlled. Accordingly, the writing speed of the non-volatile semiconductor memory device, according to the present invention, is drastically improved, as compared to the conventional ones.

According to the conventional non-volatile memory devices, there is a problem that follows. Namely, when writing, electron holes, generated in the depletion layer by the help of the tunnel effect, are accelerated, thus acquiring a high energy. Each of the electron holes with a high energy is then coupled with an electron in the adjacent channel region. This causes the generation of additional electron holes. Part of these holes then enter the tunnel oxide film. As a result, the tunnel oxide film deteriorates, and the life span of the memory cells becomes shorter. Conversely, according to the non-volatile semiconductor memory device of the present invention, the life span of the memory cells is longer due to the fact that a tunnel current cannot easily flow between the energy bands, since the overlapped region of the floating gate electrode with the drain region is far away from the depletion layer. And the hole do not enter the tunnel oxide film 15 of the insulating film 14*a*.

(Results of the Invention)

As detailed above, according to the present invention, a thin tunnel oxide film is formed between a part of the drain region and the floating gate electrode, whereas a thicker insulating film than the tunnel oxide film is formed between the other area of the drain region and the floating gate electrode. With this arrangement, the speed of writing/erasing data can be improved.

Furthermore, according to the present invention, since the region of the floating gate overlapping part of the drain region, is placed far away from the depletion layer, a tunnel current cannot easily flow between the energy bands. Therefore, both the reliability and life span of the memory cells can be improved.

A non-volatile semiconductor memory device and a manufacturing method of the same, according to the present invention, have been described in connection with certain preferred embodiments. It is to be understood that the subject matter encompassed by the present invention is not limited to those specific embodiments. On the contrary, it is intended to include all alternatives, modifications, and equivalents as can be included within the spirit and scope of the following claims.

What is claimed is:

1. A method of manufacturing a non-volatile semiconductor memory device, comprising:
    a depositing step of depositing a first insulating film (14) on top of a drain region;
    a removing step of removing a part of the said first insulating film deposited (14), where the part is located far away from its corresponding depletion layer;
    an oxidizing step of oxidizing the surface area of the said part, so as to form a second insulating film (15), which is thinner than the said first insulating film (14);
    a step of forming a first nitride film (12*a*) on an insulating film (11), which is deposited on the surface of the drain region (5), its corresponding channel region (23), and its corresponding source region (4), and also above the said channel region; wherein the said removing step forms a side wall of the said insulating film (14) on the side of the said first nitride film formed (12*a*); and
    a step of forming a second nitride film (12*b*) on a device isolating/insulating film (3), so that the distance between the said second nitride film (12*b*) and the said first nitride film (12*a*) can be longer than the distance between the said first nitride film (12*a*) and its adjacent first nitride film (12*a*).

2. The method of manufacturing a non-volatile semiconductor memory device, according to claim 1, further comprising a step of doping an area of the said drain region under the said second insulating film (15), with a dopant, so as to form a second drain region in the said drain region (5*b*), wherein the doped amount of the second drain region is more than the other area in the said drain region.

3. A method of manufacturing a semiconductor device comprising:
    forming a first insulating pattern and a second insulating pattern on a substrate;
    forming a first impurity diffusion region on said substrate between said first insulating pattern and said second insulating pattern;
    forming a first side wall on a side surface of said first insulating pattern and a second side wall on a side surface of said second insulating pattern;
    removing said first insulating pattern and said second insulating pattern; and
    forming a first insulating film at least on a part of said first impurity diffusion region between said first side wall and said second side wall.

4. The method of manufacturing a semiconductor device as claimed in claim 3, wherein said forming said first side wall and a second side wall comprises:
    forming a first insulating layer on said substrate; and
    etching back said first insulating layer to remove said first insulating layer on said first insulating pattern and said second insulating pattern.

5. The method of manufacturing a semiconductor device as claimed in claim 4, wherein said etching back said first insulating layer is performed so as to remove said first insulating layer on said part of said first impurity diffusion region between said first side wall and said second side wall.

6. The method of manufacturing a semiconductor device as claimed in claim 5, further comprising:

forming a conductive layer on said substrate after forming said first insulating film; and patterning said conductive layer to form a floating gate.

7. The method of manufacturing a semiconductor device as claimed in claim 6, wherein said patterning said conductive layer comprises:

forming a mask pattern on said conductive layer;

forming a third side wall on a side surface of said mask pattern; and etching said conductive layer by using said third side wall and said mask pattern as a mask.

8. The method of manufacturing a semiconductor device as claimed in claim 7, further comprising:

forming a dielectric insulating layer on said floating gate; and forming a control gate on said dielectric layer.

9. The method of manufacturing a semiconductor device as claimed in claim 7, wherein said floating gate is disposed at least on said first insulating film and said second side wall.

10. The method of manufacturing a semiconductor device as claimed in claim 5, further comprising:

forming a second insulating film on said substrate before forming said first insulating pattern and said second insulating pattern, and wherein said etching back said first insulating layer is performed so as to remove said second insulating film on said part of said first impurity diffusion region between said first side wall and said second side wall.

11. The method of manufacturing a semiconductor device as claimed in claim 10, further comprising:

forming a third insulating film on said substrate after removing said first insulating pattern;

forming an etching mask on said third insulating film to expose said part of said first impurity diffusion region between said first side wall and said second side wall.

12. The method of manufacturing a semiconductor device as claimed in claim 5, wherein said first insulating film is disposed apart from an edge of said first impurity diffusion region.

13. The method of manufacturing a semiconductor device as claimed in claim 4, further comprising:

forming a third insulating pattern on said substrate; and forming a second impurity diffusion region on said substrate between said second insulating pattern and said third insulating pattern, and wherein said etching back said first insulating layer is performed so as to retain said first insulating layer on said substrate between said second insulating pattern and said third insulating pattern.

14. The method of manufacturing a semiconductor device as claimed in claim 13, wherein a first distance between said first insulating pattern and said second insulating pattern is larger than a second distance between said second insulating pattern and said third insulating pattern.

15. The method of manufacturing a semiconductor device as claimed in claim 14, wherein said etching back said first insulating layer is performed so as to remove said first insulating layer on said part of said first impurity diffusion region between said first side wall and said second side wall.

16. The method of manufacturing a semiconductor device as claimed in claim 15, further comprising:

forming a second insulating film on said substrate before forming said first insulating pattern and said second insulating pattern, and wherein said etching back said first insulating layer is performed so as to remove said second insulating film on said part of said first impurity diffusion region between said first side wall and said second side wall.

17. The method of manufacturing a semiconductor device as claimed in claim 16, further comprising:

forming an isolating layer on said substrate, and wherein said first insulating pattern is formed on said isolating layer and said second insulating pattern is formed on said second insulating film.

18. The method of manufacturing a semiconductor device as claimed in claim 17, wherein said third insulating pattern is formed on said second insulating film.

19. The method of manufacturing a semiconductor device as claimed in claim 13, further comprising:

forming a third impurity diffusion region on said part of said first impurity diffusion region between said first side wall and said second side wall.

20. The method of manufacturing a semiconductor device as claimed in claim 13, wherein said first insulating pattern, said second insulating pattern, and said third insulating pattern is made of silicon nitride.

21. A method of manufacturing a semiconductor device comprising:

forming an isolating layer on a substrate;

forming a nitride layer on said isolating layer and on said substrate;

patterning said nitride layer to form a first nitride pattern on said isolating layer and a second nitride pattern on said substrate;

implanting an ion with using said first nitride pattern and said second nitride pattern as a mask to form a source region and a drain region on said substrate;

forming a first side wall on a side surface of said first nitride pattern and a second side wall on a side surface of said second nitride pattern;

removing said first nitride pattern and said second nitride pattern;

forming a gate insulating layer on said substrate between said source region and said drain region; and forming a tunnel insulating film on said substrate on said drain region, and wherein a thickness of said tunnel insulating film is smaller than a thickness of said gate insulating layer.

22. The method of manufacturing a semiconductor device as claimed in claim 21, further comprising:

forming a gate electrode after said forming said tunnel insulating film.

23. The method of manufacturing a semiconductor device as claimed in claim 21, further comprising:

forming a third nitride pattern on said substrate, and wherein a distance between said first nitride pattern and said second nitride pattern is larger than a distance between said second nitride pattern and said third nitride pattern.

* * * * *